(12) United States Patent
Tanabe

(10) Patent No.: US 6,555,273 B2
(45) Date of Patent: *Apr. 29, 2003

(54) GLASS SUBSTRATE FOR AN ELECTRON DEVICE, PHOTOMASK BLANK AND PHOTOMASK USING THE SAME

(75) Inventor: Masaru Tanabe, Yamanashi (JP)

(73) Assignee: Hoya Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/220,361

(22) Filed: Dec. 24, 1998

(65) Prior Publication Data
US 2001/0044052 A1 Nov. 22, 2001

(30) Foreign Application Priority Data
Dec. 26, 1997 (JP) ................................. 9-368836

(51) Int. Cl.⁷ .................... G03F 9/00; G06K 9/00
(52) U.S. Cl. .................... 430/5; 430/322; 382/144
(58) Field of Search .................... 430/5, 322, 323, 430/324; 382/144; 428/38; 356/239, 399, 400, 401

(56) References Cited

U.S. PATENT DOCUMENTS

| 4,669,885 A | * | 6/1987 | Ina .................... 356/443 |
| 5,355,213 A | | 10/1994 | Dotan |
| 5,965,301 A | * | 10/1999 | Nara et al. .................... 430/5 |
| 6,395,435 B1 | * | 5/2002 | Cowen et al. .................... 430/5 |

FOREIGN PATENT DOCUMENTS

| JP | 58-162038 | | 9/1983 |
| JP | 08261953 | * | 10/1996 |

* cited by examiner

Primary Examiner—Mark F. Huff
Assistant Examiner—Saleha R. Mohamedulla
(74) Attorney, Agent, or Firm—Sughrue Mion, PLLC

(57) ABSTRACT

In a glass substrate for an electron device which is selected based upon a predetermined reference set value using a method for detecting a defect for the glass substrate in accordance with optical change of an inspecting light beam, the defect for the glass substrate has no dependency for a moving direction of the inspecting light beam.

12 Claims, 4 Drawing Sheets

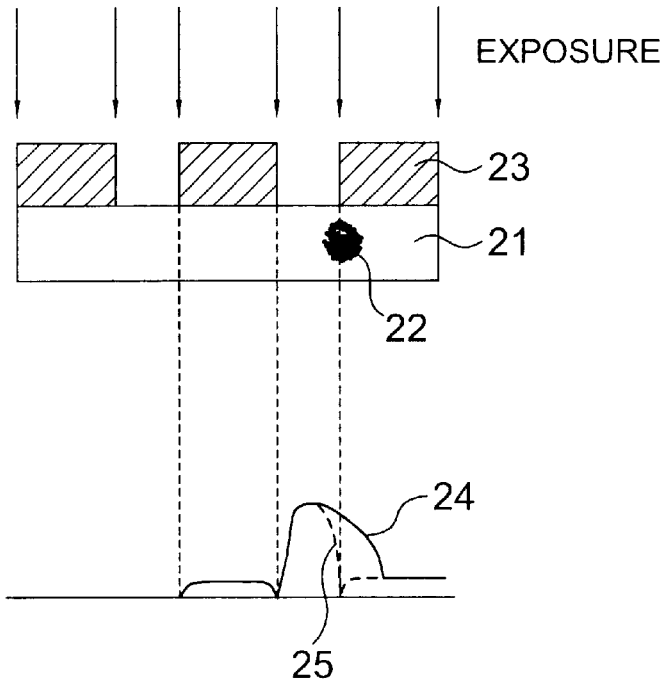
FIG. 2A
FIG. 2B
FIG. 2C
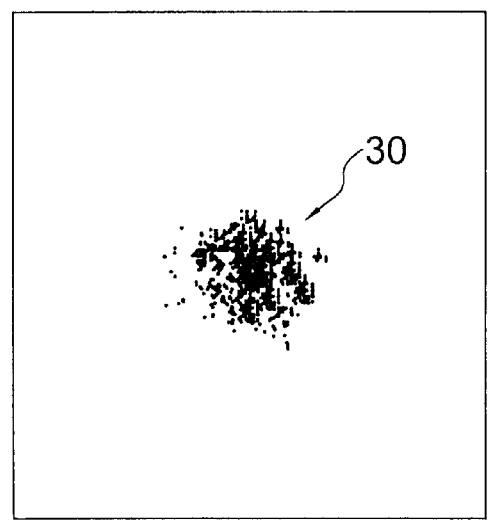
FIG. 3

GLASS SUBSTRATE FOR AN ELECTRON DEVICE, PHOTOMASK BLANK AND PHOTOMASK USING THE SAME

BACKGROUND OF THE INVENTION

This invention relates to a glass substrate which is mainly used for an electron device and which is capable of patterning with high accuracy, a photomask blank and a photomask using the glass substrate.

The known photolithography method is generally used to form a fine pattern in a step for fabricating a semiconductor integrated circuit and a photomask.

For instance, the pattern is transferred on a transparent substrate by the use of the photomask. Herein, the transparent substrate is finished to a mirror surface by accurately polishing it. Further, the photomask is made by forming the pattern thereon by the use of a light shielding film, such as, a chromium film.

Recently, strict condition has been required for fine defects (contaminant on a surface, flaw, and stain) with respect to the mirror-finished transparent substrate which is polished with high accuracy and high density.

An inspecting method for removing the fine defects from the transparent substrate has been suggested in Japanese Unexamined Patent Publication No. Sho 58-162038 (thereinafter, referred to as a conventional reference).

In this conventional reference, a light beam is focused into a fine region on a pattern surface. In this condition, a surface state of the substrate is inspected by comparing a reflected output with a transmitted output from the pattern surface.

However, in the conventional reference, only when the light beam is irradiated to a constant direction, the inspection is carried out by comparing the reflected output with the transmitted output.

In consequence, it is difficult to accurately detect a fine flaw having a specific polarity on the surface of the glass substrate even when the latest inspection apparatus is used. Further, the defect, such as the stain, inside the glass substrate can not be detected at all.

In this case, the flaw having the specific polarity is formed via a trace through which an undesirable contaminant passes by mixing the contaminant during a polishing step of the glass substrate. Alternatively, the flaw may be formed when the glass substrate is inserted into a supporting case during moving the glass substrate.

Further, the flaw may be also formed when the glass substrate is handled after the polishing step. In this event, it is difficult to detect the flaw by the normal inspecting method or apparatus disclosed in the conventional reference.

Moreover, it is assumed that the size of the flaw having the specific polarity on the surface of the glass substrate is represented by a length of a major axis direction and a length of a minor axis direction perpendicular to the major axis direction.

In this condition, the flaw having the length of the minor axis direction of 1 μm on a surface in which the flaw is cut by a cross sectional plane perpendicular to the surface can not be accurately detected in the conventional reference.

Herein, it is to be noted that when a size of a concave portion on a principal surface is hereinafter described, the size is represented by (the length of the major axis direction and the minor axis direction perpendicular to the major axis direction), and each length of the major axis direction and the minor axis direction indicates the length on the principal surface when the concave portion is cut by a cross sectional plane perpendicular to the principal surface.

In this case, it is assumed that the surface state of the glass substrate is inspected by the conventional reference, and the photomask and the phase shift mask are manufactured by the use of the inspected glass substrate.

Under this circumstance, even when the glass substrate, in which no defect is detected in the inspection, is used, the desired pattern can not be obtained when the pattern is transferred to a substance to be transferred because of pattern breakage (or clear extension). This problem takes place by the following reason.

Namely, when the defect, such as, the flaw on the surface of the substrate has dependency for a moving direction of an inspection light beam, the defect has polarity of a constant direction. Consequently, the defect may be not detected in accordance with an incident direction of the inspection light beam.

Further, when the defect, such as, the stain exists inside the substrate, the reflected output is not almost detected in the conventional reference. From these reasons, it is accidentally judged that the glass substrate has no defect in the conventional reference.

SUMMARY OF THE INVENTION

It is therefore an object of this invention to provide a glass substrate for an electron device, a photomask blank and a photomask which are capable of performing patterning and projection lithography with high accuracy.

In a glass substrate for an electron device which is selected based upon a predetermined reference set value using a method for detecting a defect for the glass substrate in accordance with optical change of an inspecting light beam, the defect for the glass substrate has no dependency for a moving direction of the inspecting light beam.

Conventionally, the inspecting light beam is introduced into a constant direction. The glass substrate is inspected by comparing the reflected output with the transmitted output. In this condition, the defect (for example, the flaw on the surface of the substrate) which has dependency in the moving direction of the inspecting light beam can not be accurately detected and removed.

Namely, the reflected output is not detected at all in many cases because only a light beam of a constant direction passes for the flaw.

In contrast, in the case of an inspecting method for inspecting non-uniformity of a translucent substance disclosed in Japanese Patent Application No. Hei 9-192763 (thereinafter, will be referred to as a related reference and will be described in more detail), the light beam is irradiated from an inner portion of the substrate toward the surface thereof in all directions for the flaw.

Thereby, even when the defect has dependency in the moving direction of the inspecting light, the defect can accurately be detected and removed.

In consequence, the pattern defect does not take place in the etching process during the patterning. As a result, the patterning can be carried out with high accuracy. Further, the exposure can be suitably performed by the use of the photomask and the phase shift mask using the glass substrate.

Herein, the optical change means that optical characteristic, such as, optical quantity, the moving direction of the light beam is varied.

Further, the reference set value means optical information (image information, light quantity, brightness, and strength distribution and the like) which is obtained in accordance with a permissible defect (having non-uniformity) for the glass substrate, and means a threshold value which is flexibly set by a user.

The inspecting light beam is introduced into the glass substrate so that the light beam transmits by repeating total reflection on the surface of the glass substrate when a light path of the glass substrate is optically uniform.

Namely, the light beam which satisfies all reflected condition is introduced into the glass substrate. Thereby, when the light path is optically uniform inside the glass substrate, the light beam covers the entire surface of the substrate in all directions.

As a result, even when the concave portion (the flaw) having the specific polarity exists on the surface of the glass substrate or the defect, such as, the stain exists inside of the glass substrate, the defect can be accurately detected with high accuracy and high speed.

The inspecting light beam is a laser light beam. Further, the surface of the glass substrate includes at least a pair of principal surfaces parallel to each other, at least a pair of side surfaces perpendicular to the principle surfaces, and a chamfered surface interposed between the principal surface and the side surface. With such a structure, the introduced laser light beam transmits inside the glass substrate so that the total reflection is carried out through the principal surfaces and the side surfaces and the laser light beam repeatedly makes a round trip at least between a pair of the side surfaces when the light path of the glass substrate is optically uniform. Thereby, the laser light beam transmits across a region which is to be inspected and is surrounded by the principal surfaces, the side surfaces and the chamfered surface.

In this condition, the introduced laser light beam repeats the total reflection through the principal surfaces, the side surfaces. Consequently, it is easy that the laser light beam is substantially sealed in the glass substrate. As a result, the inspection is practically carried out in a wide range region at the same time so that the inspection can be preferably performed at high speed. Namely, incident angles of the laser light beams are identical to each other at the principal surface on which the total reflection is repeated for the introduced laser light beam. Further, the incident angles of the laser light beams entered to the side surfaces are also identical to each other. under this circumstance, the laser light beam transmits with a constant relationship. In this relationship, when the incident angle of the laser light beam at the principal surface is selected to θ, the incident angle of the laser light beam entered to the side surface becomes 90°-θ. In this condition, the incident angle for the principal surface, through which the introduced laser light beam initially passes, is set so as to be larger than the critical angle. Further, the incident angle for the side surface is also selected so as to be larger than the critical angle. Thereby, the laser light beam is substantially sealed in the glass substrate.

The light beam is introduced from the chamfered surface, and the laser light beam is outputted from only the chamfered surface when the light path of said glass substrate is optically uniform, as a specific introducing method of the laser light beam in.

In a glass substrate for an electron device which has a concave portion on a principal surface of said glass substrate, the concave portion is represent by a first length of a major axis direction and a second length of a minor axis direction perpendicular to the major axis direction in size.

In this event, the second length on the principal surface specified when the concave portion is cut by a cross sectional plane perpendicular to the principal surface is 1 μm or less. Herein, the principal surface is positioned at a side in which a pattern is formed.

Even when a small defect of 1 μm or less exists in the minor axis direction as the size of the concave portion (the surface defect, such as, the flaw) of the glass substrate, the pattern defect does not occurs in the etching process during the patterning.

Consequently, the patterning can be carried out with high accuracy. Further, the exposure can be accurately performed by the use of the photomask and the phase shift mask using the glass substrate.

In this event, the concave portion having the size of about 0.05 μm in the minor axis direction can be accurately detected by the use of the inspecting method and the inspecting apparatus disclosed in the related reference.

The second length is 0.5 μm or less. When the second length is 0.5 μm or less, generation of the pattern defect is suppressed in the etching process during the patterning. Consequently, it is possible to pattern with high accuracy, and the reliability is largely improved.

The second length falls within the range between 0.05 and 0.25 μm. When the second length is less than 0.25 μm, although the quality may be improved, the manufacturing yield is degraded, and further, the manufacturing cost is increased.

In the glass substrate, a non-uniform portion, in which optical characteristic for a transmitted light beam is non-uniform, does not substantially exist inside the glass substrate.

This means that the non-uniform portion, such as stain or bubble, does not exist in the glass substrate. Further, this means that even when the exposure is carried out by the use of the photomask and the phase shift mask using the glass substrate, the optical strength distribution of the exposure light beam on the subject to be transferred falls within the permissible range. Namely, the non-uniform portion has excessively small non-uniformity in the above permissible range and it is negligible as the defect.

When the non-uniformity is not detected by the use of the inspecting method and the inspecting apparatus disclosed in the related reference, the glass substrate sufficiently satisfies the above condition.

As mentioned before, according to this invention, when the size of the concave portion (the surface defect, such as the flaw) on the principal surface of the glass substrate is represent by (the length of the major axis direction and the minor axis direction perpendicular to the major axis direction), the length of the minor axis direction on the principal surface specified when the concave portion is cut by a cross sectional plane perpendicular to the principal surface is equal to 1 μm or less.

Consequently, the pattern defect does not occur in the etching process during the patterning. As a result, the patterning can be carried out with high accuracy.

Further, non-uniform portion of the optical characteristic for the transmitted light beam does not substantially exist inside the glass substrate. In consequence, the exposure can be properly performed by the use of the photomask and the phase shift mask.

Moreover, the defect, which exists for the glass substrate, has no dependency for the moving direction of the inspecting light beam. Consequently, the pattern defect does not bring about in the etching process during the patterning. As a result, the patterning can be carried out with high accuracy. In addition, the exposure can be properly performed by the use of the photomask and the phase shift mask.

BRIEF DESCRIPTION OF THE DRAWINGS

FIGS. 2A through 2C are diagrams for explaining that strength distribution of an exposure light beam becomes abnormal when a phase shift mask is manufactured by the use of a glass substrate having a stain;

FIG. 3 is a diagram for illustrating an image pattern detected when a glass substrate having a stain is inspected by the use of the inspecting apparatus illustrated in FIG. 3;

DESCRIPTION OF THE PREFERRED EMBODIMENTS

First, description will be briefly made about inspecting method and apparatus which have been previously invented by the present inventors. This inspecting method and apparatus are disclosed in the above-mentioned related reference (Japanese Patent Application. Hei 9-192763).

In this method, uniformity of a translucent substance, such as, a flaw on a glass substrate or a stain inside the glass substrate can be accurately detected. Specifically, when a light path of the translucent substance is optically uniform, the light beam is introduced into the translucent substance so that total reflection occurs on the surface of the translucent substance substrate which is finished to a mirror surface.

Under this circumstance, when the non-uniform portion exists in the light path of the light beam which is introduced and transmitted into the translucent substance, the light beam is leaked from the surface. Thereby, the non-uniformity of the translucent substance is detected.

According to this method, it is possible to accurately detect the non-uniformity, such as, the flaw having the specific polarity on the surface of the glass substrate or the stain inside the glass substrate, which has not be so far accurately detected.

In particular, the flaw having the length of the minor axis direction of 1 $\mu$m can be accurately detected as the flaw on the surface of the glass substrate. In addition, it is possible to detect the non-uniformity, such as, the stain inside the glass substrate.

The following problem has been clarified by detecting or confirming the above non-uniformity of the glass substrate.

Herein, description will be made about this problem in more detail with reference with FIGS. 1A through 1F.

Figure 1A:
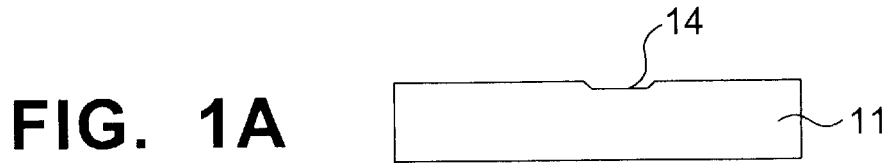
FIGS. 1A through 1F are step diagrams for explaining that a defect generates for a pattern when a photomask is fabricated by the use of a glass substrate having a flaw of a desired value or more.

In FIG. 1A, a photomask is fabricated using a glass substrate 11 which has a concave or a groove portion (for example, a flaw) 14. In this event, the concave portion 14 has the length of the minor axis direction of 1.2 $\mu$m specified as the above-mentioned manner on the principal surface of the glass substrate 11.

Figure 1B:
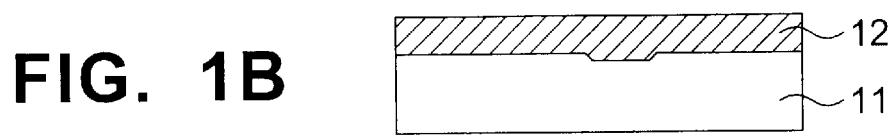

In a general photo-mask, a chromium film 12 having light shielding function or property is deposited on the glass substrate 11, as illustrated in FIG. 1B.

Figure 1C:
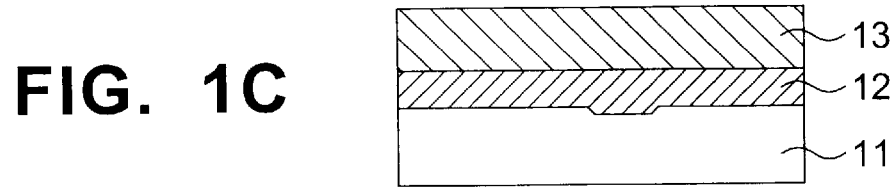
Figure 1D:
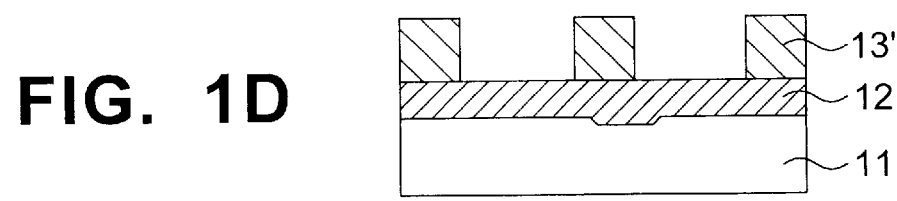

Subsequently, a resist film 13 is formed on the chromium film 12, as shown in FIG. 1C. Thereafter, the electron-beam exposure and the development are carried out for the resist film 13 to form the desired resist pattern 13', as illustrated in FIG. 1D.

Figure 1E:
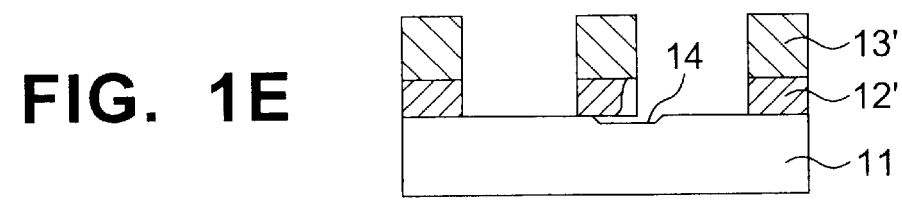

Next, the wet-etching process is performed by the use of etching liquid using the resist pattern 13' as a mask to form a chromium film pattern 12', as shown in FIG. 1E. For instance, the etching liquid is made by adding pure water into ceric nitrate ammonium and excessive oxygen salt.

Figure 1F:
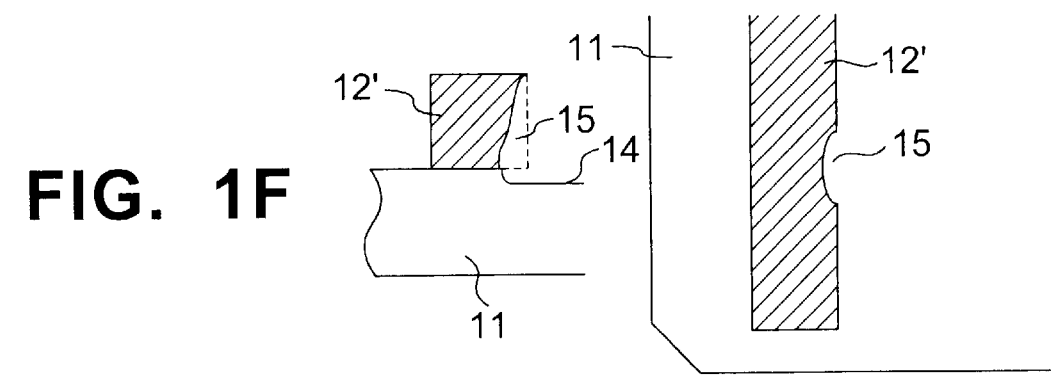

In general, a cross sectional surface of the chromium film pattern 12' is vertically over-etched by the wet-etching process. In this case, when the defect 14 exists on the surface of the glass substrate 11 from a region in which the chromium film pattern 12' is formed across a region in which the chromium film pattern 12' is not formed, the etching liquid penetrates into the chromium film 12' through the flaw 14. Thereby, pattern breakage (or clear extension) 15 inevitably takes place, as illustrated in FIG. 1F.

Herein, it is predicted that the flaw having the length of 1.2 $\mu$m gives various adverse affects in addition to the above-mentioned problem.

In FIG. 2, a phase shift mask (namely, a half-tone mask) is manufactured by using a glass substrate 21 having a stain 22 inside the glass substrate 21. Herein, it is to be noted that the stain 22 means a defect having the same transmission rate and different index of refraction.

In such a phase shift mask, a molybdenum silicide nitride (MoSiN) film having both light shielding function and phase shift function are formed on the glass substrate 21 illustrated in FIG. 2A. Thereafter, the electron-beam exposure and the development are carried out for a resist film to form a desired resist pattern (not shown).

Subsequently, the dry-etching process is performed using the resist pattern as a mask to form a MoSiN film pattern 23, as illustrated in FIG. 2B. For example, mixed gas including $CF_4$ and $O_2$ is used in the above dry-etching process. Thus, the phase shift mask is completed, as shown in FIG. 2B.

Under this circumstance, when a pattern is transferred for a substance to be transferred, such as, a semiconductor wafer, by the use of the obtained phase shift mask, optical strength distribution on the substance to be transferred becomes an abnormal distribution 24 affected by the stain 22 inside the glass substrate 21, as shown in FIG. 2C. As a result, a desired pattern can not be obtained.

Herein, it is to be noted that the reference numeral 25 corresponds to a normal optical strength distribution (indicated by the dot-line) having no stain in FIG. 2C.

Taking the above-mentioned problem into consideration, this invention provides provide a glass substrate for an electron device, a photomask blank and a photomask which are capable of performing patterning and projection lithography with high accuracy.

In the meanwhile, it is to be noted that the photo-mask blank and the photo-mask according to this invention include normal photomask blank and photomask in which the light shielding film (pattern) having light shielding function or property, such as, the chromium film or the MoSi film is formed on the transparent substrate.

In addition, they includes the phase shift mask blank and the phase shift mask in which the phase shift film (pattern)

having both light shielding function and phase shift function, such as, the MoSiN film or the MoSiON film is formed on the transparent substrate.

Figure 4A:
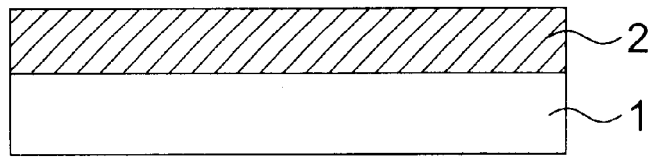
FIGS. 4A and 4B are schematic cross sectional views showing an embodiment of a photomask blank and a photomask according to this invention.
Figure 4B:
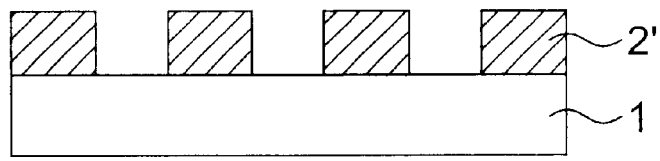

Referring to FIGS. 4A and 4B, description will be made about an embodiment of this invention.

As shown in FIG. 4A, a photo-mask blank is composed of a glass substrate 1 and a chromium film 2 having light shielding function formed on the glass substrate 1. In this event, the glass substrate was structured by a quartz glass material having a size of 152.4 mm×152.4 mm×6.35 mm in which a principal surface and side surfaces of the substrate were accurately polished.

In this condition, it was confirmed that the glass substrate 1 had no stain inside the glass substrate 1 and had a flaw on the surface thereof. However, when the flaw was detected by the use of the known atomic force microscope (AFM), the size of the flaw was equal to 1 µm or less at the length of the minor axis direction.

Subsequently, description will be made about the inspecting apparatus disclosed in the related reference (Japanese Patent Application No. Hei 9-192763) with reference with FIG. 6.

In such an inspecting apparatus, a surface of a glass substrate 1 is composed of a pair of principal surfaces parallel to each other, two pairs of side surfaces perpendicular to the principle surfaces, and a chamfered surface interposed between the principal surface and the side surface. A laser light beam from a laser 4 is reflected by mirrors 51 and 52, and is introduced from chamfered one side A (chamfered surface) of a glass substrate 1 inside the glass substrate 1. An incident angle adjusting means 53 for adjusting an incident angle for the glass substrate 1 is attached to each of the mirrors 51 and 52.

The laser light beam is introduced into the glass substrate 1 on the condition that the incident angle is changed in the range that the laser light beam occurs the total reflection on the surfaces (the principal surface and the side surface) of the glass substrate 1.

Specifically, the laser light beam is introduced from the chamfered one side A of the glass substrate 1. The introduced laser light beam repeats the total reflection at the principal surfaces and the side surfaces, and is introduced inside the glass substrate 1 so that the laser light beam is outputted from the chamfered one side A or another chamfered surface that is chamfered with the same angle as the one side A.

The laser light beam introduced into the glass substrate 1 repeats the total reflection at the principal surface and the side surfaces, reciprocating between the side surfaces, and transmits through the glass substrate 1 on the condition that the laser light beam is almost sealed in one plane (thin-plate like) region along one side B of the glass substrate 1.

In this step, the laser 4 and the mirrors 51, 53 are sequentially moved with a table 7 by a driving apparatus 6 along one side A of the glass substrate 1. Thereby, the laser light beam is transmitted throughout the entire region inside the glass substrate 1.

When the glass substrate 1 includes a non-uniform portion, such as, a flaw on the surface the substrate and a non-uniform portion, such as, the stain inside the substrate, the laser light beam is deviated or displaced from the normal light path at a portion having the flaw or a portion having different index of refraction.

In consequence, the total reflection condition is not satisfied on the surface of the glass substrate 1, and the laser light beam leaks from the principal surface or the side surfaces of the glass substrate 1. The leaked laser light beam is detected by imaging by a CCD (Charge Coupled Device) sensor 9 via a lens system 8.

Thus, the total reflection, which is physical critical phenomenon, is utilized in this inspecting apparatus. Consequently, response for the inspecting light beam in the non-uniform portion and the uniform portion also becomes critical. As a result, the non-uniformity appears with excessively clear contrast. Thereby, the non-uniformity, such as, a fine flaw can be detected with high sensitivity.

Further, the defect, such as, the stain inside the glass substrate 1 can be detected in addition to the non-uniformity on the surface of the glass substrate 1.

In a photo-mask illustrated in FIG. 4B, a resist film (not shown) is formed on the photomask blank illustrated in FIG. 4A. Thereafter, the electron beam exposure and the development are carried out for the resist film to form a desired resist pattern (not shown).

Subsequently, the wet etching is performed by the use of wet-etching liquid to form a chromium pattern 2' using the resist pattern as a mask. Herein, the etching liquid of 1000 ml is made by adding pure water into ceric nitrate ammonium of 165 g and excessive oxygen salt having concentration 70% of 42 ml. In this condition, the etching liquid is retained to the temperature of 19° C.-20° C.

Figure 5A:
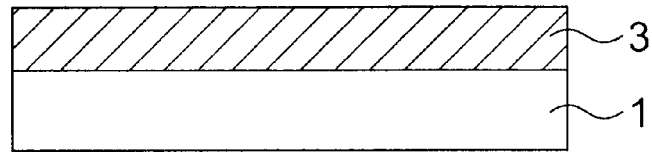
FIGS. 5A and 5B are schematic cross sectional views showing an embodiment of a phase photomask blank and a phase photomask according to this invention.

Moreover, a phase shift mask blank illustrated in FIG. 5A is composed of a glass substrate 1 and a half-tone film 3 of MoSiN which has both light shielding function and phase shift function. Herein, the MoSiN has the preselected composition (Mo: 13 at %, Si: 40 at %, N: 47 at %), index of refraction of 2.34, transmission rate of 5% in wavelength of 248 nm, and phase shift quantity of 180°.

In this event, the glass substrate 1 was structured by a quartz glass material having the size of 152.4 mm×152.4 mm×6.35 mm in which a principal surface and side surfaces of the glass substrate 1 were accurately polished.

Figure 6:
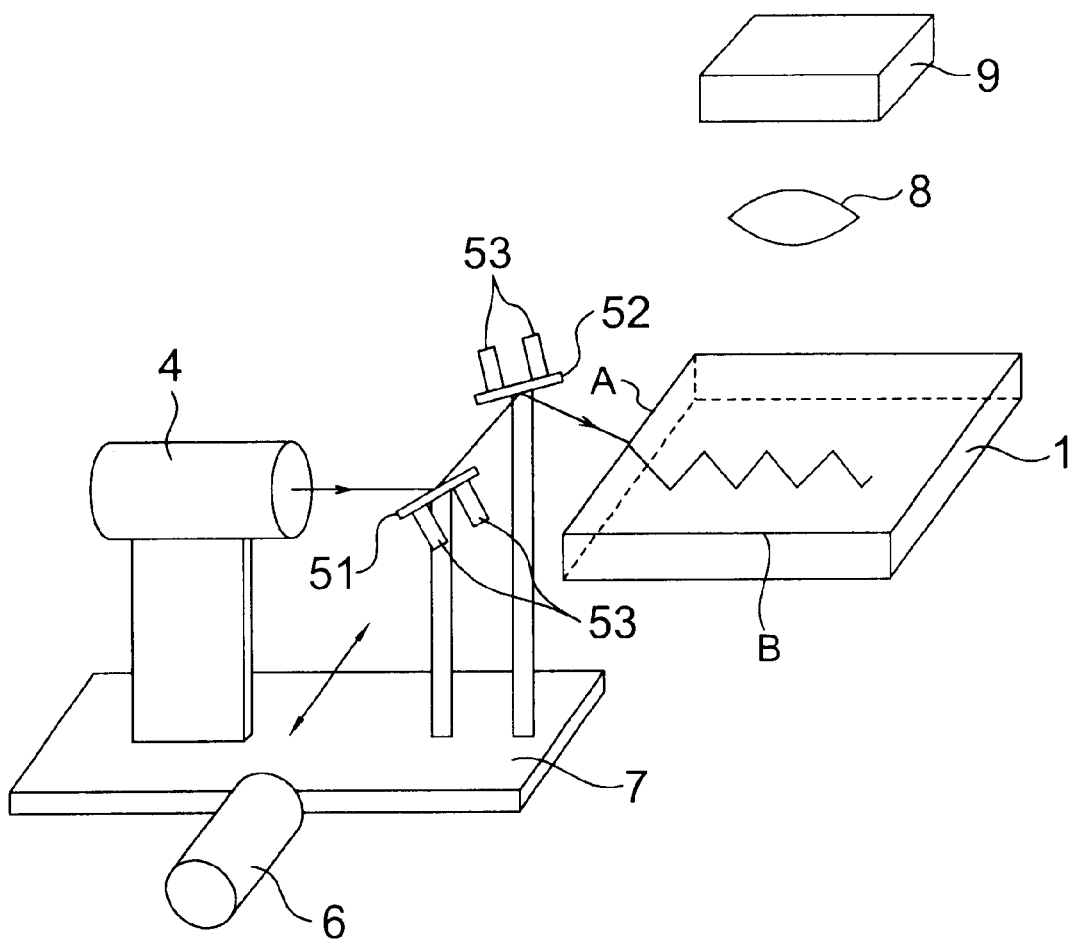
FIG. 6 is a schematic structure diagram of an inspecting apparatus for inspecting non-uniformity of a glass substrate.

In this condition, it was confirmed that the glass substrate 1 had no stain inside the glass substrate 1, and had a flaw on the surface thereof by the use of the inspection apparatus illustrated in FIG. 6.

However, when the flaw was detected by the use of the known atomic force microscope (AFM), it was confirmed that the size of the flaw was equal to 1 µm or less at the length of the minor axis direction. In this case, the half-tone film 3 of the MoSiN had the film thickness of 925Å.

Figure 5B:
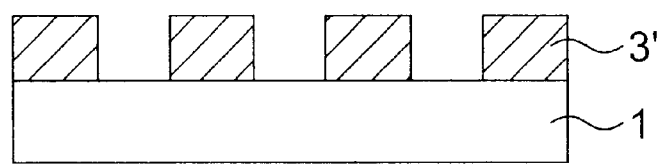

In the phase shift mask illustrated in FIG. 5B, a resist film (not shown) is formed on the photomask blank illustrated in FIG. 5A. Thereafter, the electron beam exposure and the development are carried out for the resist film to form a desired resist pattern (not shown).

Subsequently, a MoSiN film pattern 3' is formed by the use of the dry etching including mixed gas with $CF_4$ and $O_2$ by using the resist pattern as a mask.

In these photomask and phase shift mask, detected flaw exists from a region having no pattern along a region having the pattern. However, when the respective patterns were inspected in the above-mentioned manner, it was confirmed that the desired pattern did not have a defect, such as, pattern breakage.

Further, although the pattern was transferred to the substance to be transferred by the use of these photomask and the phase shift mask, the pattern was excellently transferred.

Moreover, three of the quartz glass substrates having the size of 152.4 mm×152.4 mm×6.35 mm, in which the principal surface and the side surfaces of the substrate were accurately polished, were prepared like the above-mentioned embodiment. The non-uniformity on the principal surface of the glass substrate was inspected for these glass substrates by the use of the inspecting apparatus illustrated in FIG. 6. As a result, it was confirmed that the glass substrate had flaws of 0.5 μm, 0.3 μm and 0.1 μm at the length of the minor axis direction.

In this condition, the same film as the above embodiment was deposited on the glass substrate, and the phase shift mask was obtained by patterning. Although the pattern was transferred to the substance to be transferred by the phase shift mask, the pattern was excellently transferred, and the reliability of the pattern formation could be improved in comparison with the case of the above flaw of 1 μm.

Subsequently, description will be made about a comparative embodiment to compare with the above-mentioned embodiment.

The quartz glass substrates having the size of 152.4 mm×152.4 mm×6.35 mm, in which the principal surface and the side surfaces of the glass substrate were accurately polished, was obtained or prepared. The non-uniformity on the principal surface of the glass substrate was inspected for these glass substrates by the use of the inspecting apparatus illustrated in FIG. 6. As a result, it was confirmed that the glass substrate had a flaw of 2 μm in a region at the length of the minor axis direction for the principal surface of the substrate. Herein, the length of the flaw was measured by the atomic force microscope (AFM).

In this case, it is estimated that the flaw was formed by a trace along which an undesirable contaminant passed inside the glass substrate. Herein, the contaminant was mixed into the glass substrate during the polishing step of the substrate.

Under such a circumstance, the photomask and the phase shift mask were fabricated in the same manner as the above-mentioned embodiment, respectively. When the obtained photomask pattern was inspected, the pattern breakage (namely, clear extension) was generated.

Further, when the non-uniformity inside the glass substrate was inspected by the use of the inspecting apparatus illustrated in FIG. 6, an image pattern 30 in FIG. 3, in which calescence points were collected in a spheroidal form, was detected, and it was confirmed that the stain existed inside the glass substrate. In this event, the stain could not be detected by the use of the optical microscope.

Moreover, the phase shift mask was manufactured by the use of the glass substrate in the same manner as the above-mentioned embodiment. When the pattern was transferred on a semiconductor wafer by the use of the obtained phase shift mask, the pattern, which was displaced from the line width, was detected.

This was caused by the affect of the stain inside the glass substrate. In consequence, the optical strength distribution on the semiconductor wafer was deviated from the design value, and the pattern was transferred with abnormal optical strength distribution.

Subsequently, description will be made about an another embodiment.

A quartz glass substrates having the size of 152.4 mm×152.4 mm×6.35 mm, in which the principal surface and the side surfaces of the glass substrate were accurately polished, was obtained.

The non-uniformity of the surface of the glass substrate was inspected by the use of the inspecting apparatus illustrated in FIG. 6 to select an acceptable product or a defective product.

Specifically, the relationship (information) between the kinds (the flaw or crack on the surface portion, the stain and the contaminant inside the substrate and the like) of the non-uniformity in connection with the glass substrate or the size (area, length, width, depth, region and the like) and optical information (optical quantity of the leaked light beam, brightness, strength distribution, depth from the surface) leaked from the surface is stored in advance.

Under this condition, the optical information (reference set value) corresponding to the permissible range of the non-uniformity was compared with the optical information detected by the inspection. As a result, the glass substrate, in which the detected optical information satisfies the reference set value, was selected.

The photo-mask was manufactured by the use of the selected glass substrate in the same manner as the above-mentioned embodiment. When the pattern of the obtained photomask was inspected, it was confirmed that the pattern had no pattern breakage, and the desired pattern was formed. Further, although the pattern was transferred to the substance to be transferred by the use of the phase shift mask, the pattern was excellently transferred.

Subsequently, description will be made about a comparative embodiment to compare with the above-mentioned another embodiment.

A quartz glass substrates having the size of 152.4 mm×152.4 mm×6.35 mm, in which the principal surface and the side surfaces of the glass substrate were accurately polished, was obtained or prepared. The glass substrate was inspected by the use of the conventional inspecting method according to the conventional reference (Japanese Unexamined Patent Publication. No. Sho 58-162038).

As mentioned before, the light beam is focussed to the fine region on the surface of the glass substrate and the inspection is carried out by comparing the reflected output with the transmitted output in the conventional reference. Thereby, the surface state of the glass substrate was inspected to select an acceptable product or a defective product.

Specifically, the transmitted output was compared with the reflected output, and the glass substrate having the reflected output of the reference set value or less was selected.

The photomask was fabricated by the use of this glass substrate in the same manner as the above-mentioned embodiment. When the obtained photomask pattern was inspected, the pattern breakage occurred.

Moreover, when the glass substrate selected as the acceptable product in the conventional reference was inspected by the use of the inspecting apparatus illustrated in FIG. 6, the light beam, which was leaked from the surface of the glass substrate, was detected. In this event, it was confirmed that the detected light beam exceeded the reference set value which was set in advance.

This is because the glass substrate of the comparative embodiment includes the defect having dependency in the moving direction of the inspection light beam, such as, the flaw on the surface of the substrate. On the other hand, the glass substrate of the embodiment of this invention includes no defect having dependency in the moving direction of the inspection light beam.

Although this invention has been so far explained for the above embodiments or examples, this invention is not limited to the above-mentioned embodiments.

For instance, although the glass substrate has been described as the glass substrate for the electron device, the glass substrate is not limited to this, and is applicable for a glass substrate for information recording medium (a magnetic disk or an optical disk), and a glass substrate for a liquid display.

Further, the light shielding film is not to chromium, and may be a material containing at least one selected from the group consisting of chromium, oxygen, nitrogen, and carbon. Alternatively, the light shielding film may be a film, such as, aluminum, molybdenum silicide (MoSi) or a material containing at least one selected from the group consisting of oxygen, nitrogen, and carbon into these films.

Moreover, the light shielding film may be formed by two or more layers other than a single layer.

Further, the semi-translucent film (half-tone film) is not limited to the film consisting of molybdenum, silicon, and nitrogen, and may be, for example, a semi-translucent film consisting of molybdenum, silicon, and oxygen or a semi-translucent film consisting of molybdenum, silicon, oxygen and nitrogen or a semi-translucent film consisting of a metal selected from the group of consisting of tungsten, titanium, tantalum and chromium, and silicon, oxygen and/or nitrogen.

In addition, the phase shift mask is not limited to the half-tone mask described in the above embodiment, and may be a phase shift mask of Levenson-type in which a film (for example, $SiO_2$) having phase shift function is formed between the light shielding films or a phase shift mask which is formed by films of two or more layers having phase shift function and is formed by a SOG (Spin on Glass) film.

What is claimed is:

1. A method of manufacturing a photomask blank by preparing a glass substrate for the photomask blank and depositing a thin film having at least a light shielding function on a principal surface of the glass substrate, wherein:

the glass substrate is selected based upon a predetermined reference set value using a method for detecting a defect for said glass substrate in accordance with optical change of an inspecting laser beam emitted from a laser source;

the surface of said glass substrate including at least a pair of principal surfaces parallel to each other, at least a pair of side surfaces perpendicular to the principle surfaces, and at least one chamfered surface interposed between a principal surface and at least one side surface, said principal and said side surfaces being subjected to precision polishing;

the defect being detected by introducing the laser beam in the manner such that, when a light path in the glass substrate is optically uniform, the laser beam propagates through the glass substrate to cause total reflection on the principal surfaces and the side surfaces and propagates reciprocally between at least a pair of side surfaces so that the laser beam travels throughout an inspected region surrounded by the principal surfaces, the side surfaces, and the at least one chamfered surface and by detecting the laser beam leaking from the principal surfaces, wherein:
    the laser beam is introduced through a chamfered surface;
    the laser beam being emitted only from a chamfered surface when the light path of the glass substrate is optically uniform.

2. A method as claimed in claim 1, wherein:
    the glass substrate is a glass substrate for a mask blank;
    the reference set value being selected so that, when a mask pattern is formed on the glass substrate, the mask pattern is prevented from a pattern breaking defect.

3. A method as claimed in claim 1, wherein:
    the glass substrate is a glass substrate for a mask blank;
    the reference set value is selected so that, when a pattern is transferred for an object by the use of a photomask having a mask pattern on said glass substrate, a predetermined pattern is obtained.

4. A method of manufacturing a photomask blank by preparing a glass substrate for the photomask blank and depositing a thin film having at least a light shielding function on a principal surface of the glass substrate, wherein:

the surface of the glass substrate including at least a pair of principal surfaces parallel to each other, at least a pair of side surfaces perpendicular to the principle surfaces, and at least one chamfered surface interposed between the principal surface and at least one side surface, said principal and said side surfaces being subjected to precision polishing;

the glass substrate being such that, where the dimension of a damage present on the principal surface of the glass substrate and having a particular directivity is represented by a first length in a major-axis direction and a second length in a minor-axis direction perpendicular to the major-axis direction, the second length of the damage in the minor-axis direction is equal to 1 µm or less when the damage is cut along a plane perpendicular to the principal surface wherein:
    the second length of the damage in the minor-axis direction is not greater than 0.5 µm.

5. A method as claimed in claim 4, wherein:
    the second length of the damage in the minor-axis direction falls between 0.05 and 0.25 µm.

6. A method as claimed in claim 4, wherein:
    the substrate is sorted by introducing a laser beam in the manner such that, when a light path in the glass substrate is optically uniform, the laser beam propagates through the glass substrate to cause total reflection on the principal surfaces and the side surfaces and propagates reciprocally between at least a pair of side surfaces so that the laser beam travels throughout an inspected region surrounded by the principal surfaces, the side surfaces, and the at least one chamfered surface and by detecting a defect in accordance with optical change of the laser beam leaking from the principal surfaces.

7. A method as claimed in claim 4, wherein:
    a laser beam is introduced through the chamfered surface;
    the laser beam being emitted only from a chamfered surface when the light path of the glass substrate is optically uniform.

8. A method of manufacturing a photomask blank by preparing a glass substrate for the photomask blank and depositing a thin film having at least a light shielding function on a principal surface of the glass substrate, wherein:

the surface of the glass substrate including at least a pair of principal surfaces parallel to each other, at least a pair of side surfaces perpendicular to the principle surfaces, and at least one chamfered surface interposed between the principal surface and at least one side surface;

a laser beam being introduced in the manner such that the laser beam propagates through the glass substrate to cause total reflection on the principal surfaces and the side surfaces and propagates reciprocally between at least a pair of side surfaces so that the laser beam travels throughout an inspected region surrounded by the principal surfaces, the side surfaces, and the at least one chamfered surface;

the glass substrate being such that no stain within the glass substrate is detected when detection of a defect is carried out in accordance with optical change of the laser beam leaking from the surface of the glass substrate, wherein:

the laser beam is introduced through the chamfered surface;

the laser beam being emitted only from the chamfered surface when the light path of the glass substrate is optically uniform.

9. A method as claimed in claim 8, wherein:

the glass substrate being such that, where the dimension of a damage present on the principal surface of the glass substrate and having a particular directivity is represented by a first length in a major-axis direction and a second length in a minor-axis direction perpendicular to the major-axis direction, the second length of the damage in the minor-axis direction is equal to 1 $\mu$m or less when the damage is cut along a plane perpendicular to the principal surface.

10. A method as claimed in claim 1, wherein:

a photomask is manufactured by patterning the thin film.

11. A method as claimed in claim 4, wherein:

a photomask is manufactured by patterning the thin film.

12. A method as claimed in claim 8, wherein:

a photomask is manufactured by patterning the thin film.

* * * * *